United States Patent [19]

Grubb

[11] 4,307,438

[45] Dec. 22, 1981

[54] HINGED BACK PANEL INPUT/OUTPUT BOARD

[75] Inventor: Richard M. Grubb, Cumberland, R.I.

[73] Assignee: Augat Inc., Attleboro, Mass.

[21] Appl. No.: 109,652

[22] Filed: Jan. 4, 1980

[51] Int. Cl.³ ............................................. H05K 7/06
[52] U.S. Cl. .................................. 361/413; 361/412; 361/428; 339/4
[58] Field of Search .......... 339/4, 75 M, 17 F, 198 R, 339/198 G, 198 K; 361/398, 412, 413, 415, 426, 428, 429, 380

[56] References Cited

U.S. PATENT DOCUMENTS

| | | | |
|---|---|---|---|
| 2,740,097 | 3/1956 | Edelman | 339/17 F |
| 3,356,905 | 12/1967 | Linn | 339/4 |
| 3,382,414 | 5/1968 | Borner | 361/412 |
| 3,489,954 | 1/1970 | Humphrey, Jr. | 361/413 |
| 3,701,071 | 10/1972 | Landman | 339/4 |
| 4,143,932 | 3/1979 | Boutros | 339/17 F |
| 4,169,650 | 10/1979 | Schweizer | 339/198 R |

FOREIGN PATENT DOCUMENTS 1591563  2/1970  Fed. Rep. of Germany .......... 339/4

Primary Examiner—Gerald P. Tolin
Attorney, Agent, or Firm—Weingarten, Schurgin & Gagnebin

[57] ABSTRACT

A back panel input/output board for any back panel/plug-in board assembly, often in combination with a rack for holding the boards coupled to the back panel. The wires from the back panel connectors are connected to contact pins on a separate board which is hinged to the back panel. The hinged board, with connector patterns of contact pins, provides external access for inputs to and outputs from the back panel.

11 Claims, 6 Drawing Figures

HINGED BACK PANEL INPUT/OUTPUT BOARD

FIELD OF THE INVENTION

This invention relates generally to electronic interconnection devices and more particularly relates to a means for providing input and output interconnections from a back panel without using any surface area of the back panel.

DISCUSSION OF THE PRIOR ART

The term "back panel" is often employed to refer to a mother board having a plurality of edge connectors mounted thereto, each of which receives the connector edge of a daughter board. Such daughter boards may have a large number of integrated circuits and other electronic components mounted thereon, and may have wire wrapping pins extending from one side for interconnecting the components on the board. The daughter board may also be a conventional printed circuit board having components interconnected through etched traces. The daughter board is connected to other daughter boards and externally, through the mother board which is often the back of a rectangular rack which helps to support the daughter boards. Once interconnection is made between the mother and daughter boards, there must be some means of making external connections from the mother board.

One way in which input-output connections have been made to back panels is to provide a relatively large female connector having a multiple wire flat cable extending therefrom mounted over the ends of one or two rows of wire wrapping pins extending from the bottom of the back panel. It sometimes occurs, however, that the level of wraps on the wire wrapped pins is such that there is not sufficient pin length remaining for proper connection to such a female connector. Furthermore, there is not always a mating plug or connector size for all of the possible pin configurations which back panels may have. It is also possible to damage the top wrap on one or more of the pins by making such connections thereto. Additionally, it is not always considered to be acceptable by the industry to attach devices other than wrapping wires to the ends of wire wrapping pins since the pins are designed to have a specific length and to have the purpose of interconnecting between other pins with solid 30 gauge wire.

Another method of externally connecting to a back panel is to extend individual wires from the wire wrapping pins of the back panel outwardly to other devices, central connectors or other boards. However, since the pins are designed to be wrapped with solid 30 gauge wire, these wires are generally considered to be too fragile to provide the proper interconnection to a back panel from external devices and connectors. For external connections it is generally desired to use 22 to 26 gauge stranded wire which cannot be wrapped on standard wire wrapping pins.

Still another way in which external connections have been made to back panels is to sacrifice a portion of the back panel real estate or surface area to insert a rack and panel type connector which has wire wrapping pins extending from one side and comprises either a male or a female plug on the other side. A mating plug having wires extending externally therefrom can then be plugged into this connector. Of course, the disadvantage is obvious in that edge connectors and daughter boards cannot be used in the positions taken up by such a connector.

SUMMARY OF THE INVENTION

Broadly speaking, this invention solves the problems relating to external interconnection to back panels by providing a second board hinged to an otherwise standard back panel, the external connections being made to the second board. There is no further modification to nor is there any loss of space on the standard back panel or mother board. The hinged board, with wire wrapping pin contacts having either a male or a female configuration, employs what may be termed a mezzanine approach in that in its final position, it is spaced from and parallel to the back panel and provides pluggability for external interconnection devices. This supplies all of the external input/output connections necessary without sacrificing any of the real estate of the back panel. Standard 30 gauge solid interconnection wire may be connected between the wire wrapping pins of the back panel and the wire wrapping pins of the hinged board arranged in socket patterns to match the mating plug on the other side of the hinged board. Mating plugs with externally extending flat cable or discrete wires, normally in bundles, provide for the pluggable interface.

BRIEF DESCRIPTION OF THE DRAWING

The objects, advantages and features of this invention will be more readily understood from the following detailed description when read in conjunction with the drawing in which.

DESCRIPTION OF THE PREFERRED EMBODIMENTS

Figure 1:
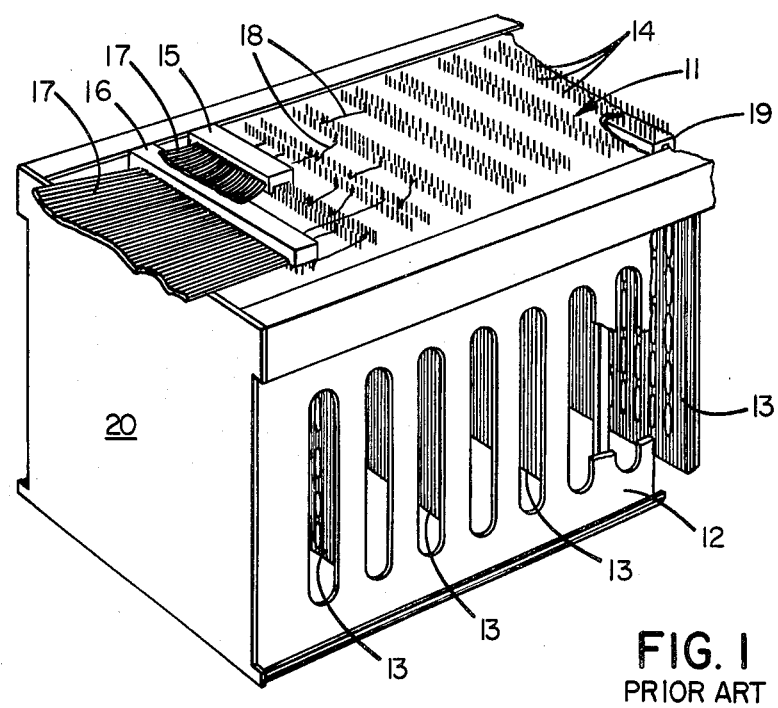
FIG. 1 is a fragmentary perspective view of a back panel mounted to a rack showing one aspect of the prior art.
Figure 3:
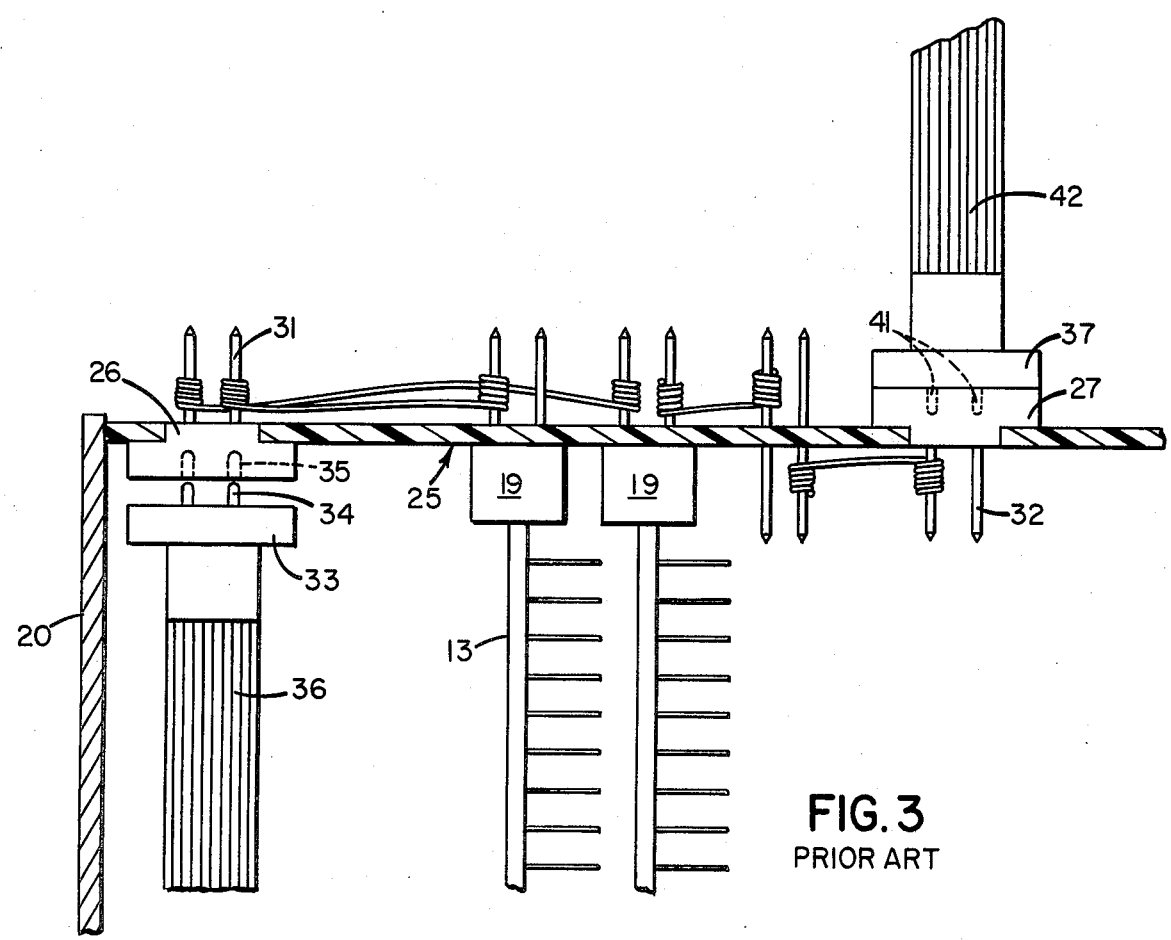
FIG. 3 is a fragmentary sectional view showing still another prior art method of making external connections to the back panel.
Figure 2:
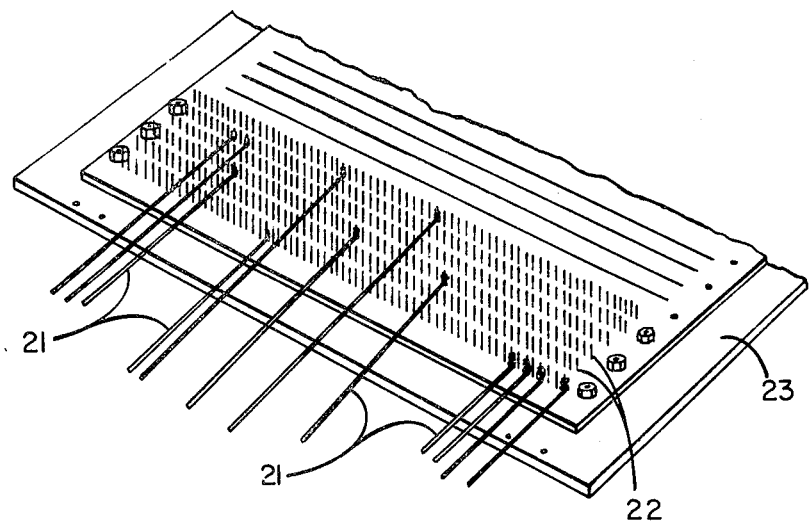
FIG. 2 is a fragmentary perspective view of a back panel showing a different prior art input/output device.

With reference now to the drawing there are shown in FIGS. 1, 2 and 3 examples of the prior art for providing input/output connections to a back panel. In FIG. 1 back panel 11 is shown connected in a typical rack 12 adapted to receive a plurality of smaller daughter panel boards or cards 13 which are plugged into back panel or edge connectors 19 mounted to the back panel on the side within the rack 12. The external or bottom side of back panel 11 facing away from the inside of rack 12 is formed with a multiplicity of wire wrapping pins 14 normally arranged in dual rows across the back panel. Two female connectors 15, 16 are shown somewhat schematically in FIG. 1, connector 15 being mounted on a portion of a dual row of wire wrapping pins and connector 16 being mounted to an entire dual row of pins. Each of the connectors 15, 16 has a multiplicity of wires 17 leading therefrom, normally in the form of flat cables which are multiconductor single cables arranged in a flat form. In this arrangement, pins in any of the rows on the external side of back panel 11 may be connected by means of wires 18 to a pin in one of the rows to which connectors 15, 16 are coupled. In this way, the flat cables extending from connectors 15, 16 provide the external connections to the circuitry mounted on the cards 13 in rack 12.

FIG. 2 shows an alternative embodiment of the prior art wherein wires 21 provide direct outside connection from the wire wrapping pins 22 of panel board or back panel 23. This method has generally proven unsatisfactory for the reasons outlined in the Discussion of the Prior Art above. Solid wire is required for wire wrapping and usually designers prefer stranded wire for plug assemblies for flexibility.

FIG. 3 shows an alternative embodiment of the prior art in two different modes. Either of these embodiments displaces some of the planar dimension or real estate of the back panel 25 through the use of a connector 26 or 27. Connector 26 may be mounted with wire wrapping pins 31 extending from the bottom side of back panel 25 and identical connector 27 is mounted with the wire wrapping pins 32 extending into the rack from the top side of the back panel. Plug 33 having male pins 34 projecting therefrom adapted to be received in female sockets 35 in connector 26 provides the external access by means of wires 36. Likewise, plug 37 has male pins which mate with sockets 41 in connector 27 and provides external access by means of wires 42. It should be noted that plugs 33 and 37 may be either male or female type for purposes of connecting to a male or female connector 26, 27, and wires 36 and 42 may be formed in a bundle or as a flat ribbon. Connector 26 is shown adjacent end panel 20 of rack 12 although it may be located at any desired position on back panel 25.

Figure 4:
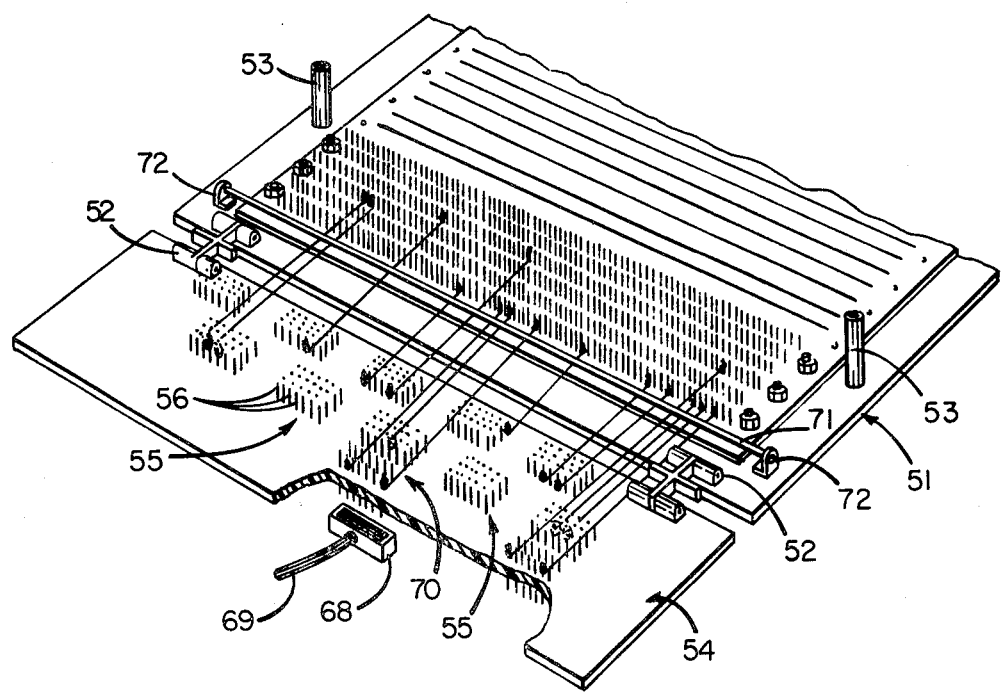
FIG. 4 is a fragmentary perspective view showing the back panel input/output hinged board of the present invention in an open position.
Figure 5:
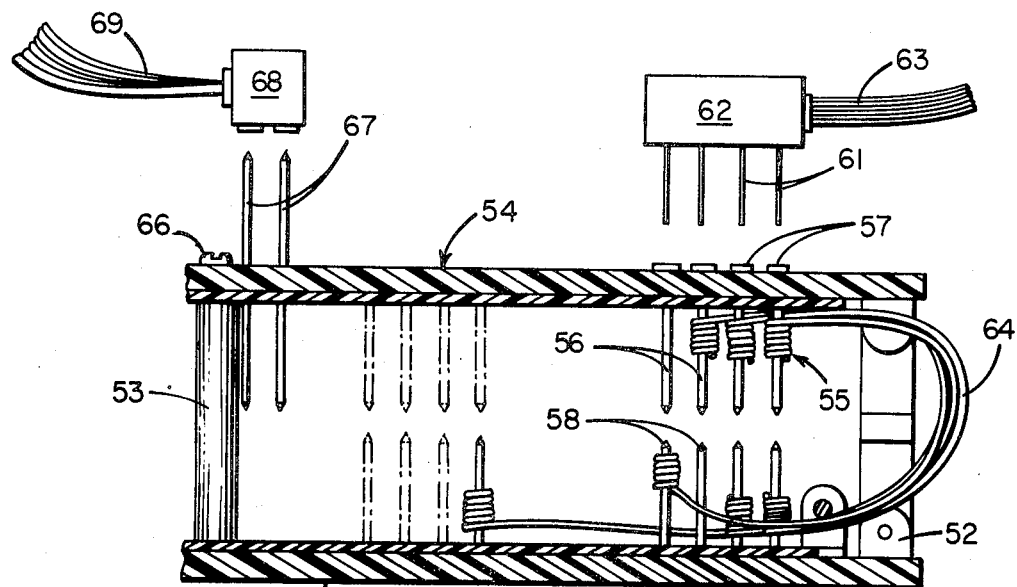
FIG. 5 is a fragmentary sectional view showing the board of the invention in a closed or parallel condition.
Figure 6:
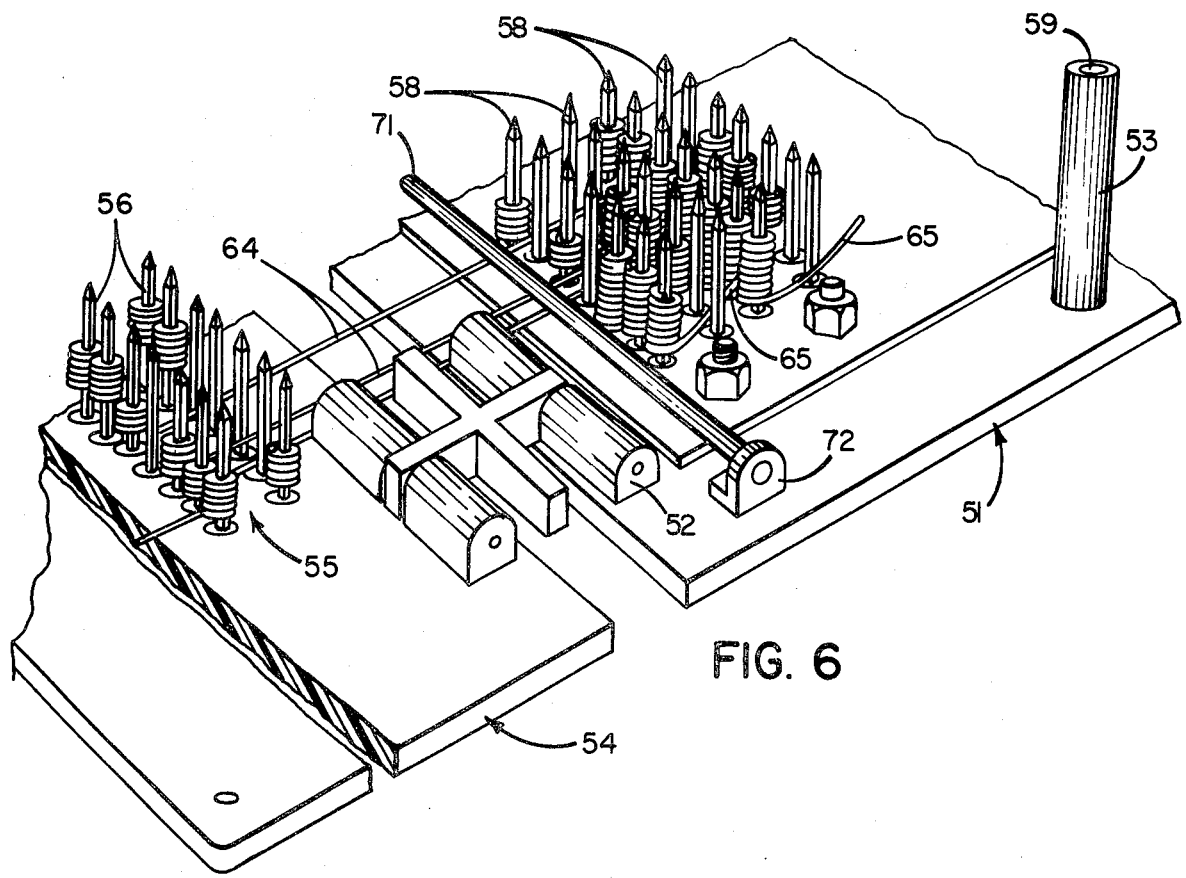
FIG. 6 is an enlarged fragmentary perspective view of the invention.

The present invention is shown in FIGS. 4–6 and may employ any back panel. Back panel 51 is fitted with hinges 52 and may also include stand-offs or spacers 53 if necessary. An interconnection board 54 is coupled to panel 51 by means of the hinges, and contains groups 55 of wire wrapping pins 56. The wire wrapping pins are preferably configured as either socket contacts 57 (FIG. 5) adapted to pluggably receive the projecting pins 61 of connector 62, or as an array 70 of male feedthrough pins 67 adapted to pluggably mate with female plug 68. A bundle 63 of wires extends from connector 62 for external connection of group 55 of pins to other devices or central connector means. A similar bundle of wires 69 extends from connector 68 for external connection of array 70 of pins.

It is clearly shown in FIG. 6 how pins 58 of back panel 51 are connected by wire wrapping wires 64 to pins 56 of board 54. Several pins 58 on panel 51 may be mutually interconnected by wire wrapping wires 65, and finally connected to board 54 by another such wire 64. This accounts for the fact that some of the pins 58 have two levels of wrap instead of one.

Board 54 may be pivoted by means of hinges 52 from an open position parallel with and in the same plane as panel 51 (FIG. 6) to a second or closed position parallel with and facing panel 51 in spaced relationship thereto (FIG. 5). Spacers 53 maintain the end of board 54 opposite hinges 52 in a spaced relationship from panel 51. The hinges may be of any type which maintain the boards parallel, whether they are in the same plane or are in spaced relationship. The combination of hinges 52 and spacers 53 maintain board 54 spaced from panel 51 by a distance which is slightly greater than the combined lengths of wire wrapping pins 56 and 58 so that there is no danger of shorting between such pins when the boards are in facing or closed relationship. It is possible that a hinge may be the only element necessary to maintain the parallel relationship in the closed position, so that spacers 53 would be superfluous.

With reference now to FIGS. 1 and 5, the advantages of this invention may easily be appreciated. Back panel 51 may be placed in rack 12 in a manner similar to panel 11 shown in FIG. 1. Because of the input/output structure of this invention, none of the real estate of panel 51 is lost because of the necessity of external interconnections; all of its surface area may be used for edge connectors to receive daughter boards or cards 13. Board 54 is hinged so that it uses only Z-dimensional space, that is, the space beneath rack 12 extending beyond panel 51. Conventional terminology refers to surface dimensions as X and Y dimensions, and anything spaced from the board is in the Z-direction. It is normal in the industry to have excess Z-dimension available behind a back panel and this invention utilizes that space while obviating the need for using the surface area of the back panel. The length of the back panel usually is confined by standard sizes for racks 12.

When panel 51 and board 54 are in substantially the same plane as shown in FIGS. 4 and 6, interconnections between them are normally accomplished by wire wrapping means. When such interconnections have been completed, board 54 is folded over panel 51 and it may be secured in place by means of bolt 66 which engages threads in opening 59 in spacer 53. In order to be sure that wires 64 properly fold with board 54 and prevent stresses from occurring, a strain relief bar 71 may be mounted to either board 51 or board 54. In the drawing, bar 71 is shown mounted to board 51 by means of brackets 72.

Sockets 57 and pins 67 may be arranged in rectangular arrays to receive the pins of connectors 62 or the openings of connector 68 respectively, from which external connections are made. Of course, other shapes and types of connectors may be used to couple to board 54 for external connection.

It may now be readily appreciated that the problems outlined hereinabove associated with the prior art methods and devices employed for external connection to a back panel are obviated by this invention. In view of this disclosure it is likely that changes and improvements will occur to those skilled in this art which are within the scope of the appended claims.

What is claimed is:

1. An apparatus comprising:
    an interconnection board;
    a back panel having a bottom side and a top side;
    at least one logic card pluggably connected to said top side of said back panel;
    hinge means coupling said board to said back panel, said hinge means being so constructed that said board lies in substantially the same plane as said back panel when in the open position for making interconnections between said back panel and said board, and when rotated on said hinge means by 180° to the closed position, said board lies in parallel confronting relationship with said back panel;
    a first plurality of connecting pins extending from said bottom side of said back panel;
    a second plurality of connecting pins extending from one side of said board in the same direction and parallel with said first plurality of connecting pins when said board is in the open position;

a plurality of discrete wires spaced from said logic card and interconnecting selected pairs of pins, one of said pins of each pair being located on said back panel and the other of said pins being located on said board; and means connected to said interconnection board for pluggably making external input/output connections to said pins in said board.

2. The apparatus recited in claim 1 and further comprising spacer means located on one of said back panel and said board for maintaining said board spaced from said back panel when in the closed position.

3. The apparatus recited in claim 1 and further comprising an elongated strain relief bar mounted on one of said back panel and said board for directing said plurality of wires when said board is moved from the open to the closed position.

4. The apparatus recited in any of claims 1–3 wherein at least some of the pins of said second plurality of connecting pins are arranged in discrete arrays.

5. The apparatus recited in any of claims 1–3 wherein at least some of the pins of said second plurality of connecting pins are formed with a socket in one end adapted to receive the pins of a connector.

6. The apparatus recited in any of claims 1–3 wherein at least some of the pins of said second plurality of connecting pins are formed with elongated pins extending from both ends and from both sides of said board.

7. The apparatus recited in claim 1 wherein when in the closed position said board is in parallel confronting relationship with the bottom side of said back panel.

8. The apparatus recited in claim 4 wherein said pluggable external connection means comprises a connector having pins extending therefrom in one direction and a plurality of wires for external connection extending therefrom in another direction, said pins being coupled with one of said arrays of said second plurality of connecting pins.

9. The apparatus recited in claim 4 wherein said pluggable external connection means comprises a connector having female connector means on one side thereof and a plurality of wires for external connection extending from another side thereof, said female connector being coupled with one of said arrays of said second plurality of connecting pins.

10. The apparatus recited in claim 4 wherein the pins in at least some of said arrays are formed with a socket in one end and the pins in others of said arrays are formed with elongated pins extending from both ends and from both sides of said board.

11. The apparatus recited in any of claims 1–3 wherein when in the closed position, said first and second plurality of connecting pins are in spaced confronting relationship and are prevented from mutual interference by the distance between said board and said back panel by said hinge means and said spacer means.

* * * * *